United States Patent [19]

Chand et al.

[11] Patent Number: 5,440,575
[45] Date of Patent: Aug. 8, 1995

[54] ARTICLE COMPRISING A SEMICONDUCTOR LASER WITH STBLE FACET COATING

[75] Inventors: Naresh Chand, Berkeley Heights; Robert B. Comizzoli, Belle Mead, both of N.J.; John W. Osenbach, Kutztown, Pa.; Charles B. Roxlo, Bridgewater; Won-Tien Tsang, Holmdel, both of N.J.

[73] Assignee: AT&T Corp., Murray Hill, N.J.

[21] Appl. No.: 223,877

[22] Filed: Apr. 6, 1994

[51] Int. Cl.$^6$ .............................................. H01S 3/19
[52] U.S. Cl. ...................... 372/49; 257/79; 257/100; 257/632
[58] Field of Search ............... 372/49; 257/632, 79, 257/100

[56] References Cited

U.S. PATENT DOCUMENTS

| | | | |
|---|---|---|---|
| 4,337,443 | 6/1982 | Umeda et al. | 372/49 |
| 4,951,291 | 8/1990 | Miyauchi et al. | 372/49 |
| 4,962,985 | 10/1990 | LeGrange | 372/49 |
| 5,144,634 | 9/1992 | Gasser et al. | 372/49 |
| 5,144,635 | 9/1992 | Suhara | 372/49 |

OTHER PUBLICATIONS

"Real-Time In Situ Monitoring of Antireflection Coatings for Semiconductror Laser Amplifiers by Ellipsometry", by F-Fan Wu et al., *IEEE Photonics Technology Letters*, vol. 4, No. 9, Sep. 1992, pp. 991-993.

"The Use of Molecular Beam Techniques for the Fabrication of Optical Thin Films and Structures", by I. T. Muirhead et al., *SPIE*, vol. 1019, pp. 190-197 (1988) (no month).

"Broadband Optical Monitoring of Filters Fabricated Using Molecular Beam Deposition", by S. P. Fisher et al., *SPIE*, vol. 1266, pp. 76-85 (1990) (no month).

"New Techniques Revolutionize Thin-Film Optical Coatings", by H. A. Macleod, *Laser Focus World*, Nov. 1992, pp. 111-118.

"Increasing the Far-Ultraviolet Reflectance of Silicon-Oxide-Protected Aluminum Mirrors by Ultraviolet Irradiation", by A. P. Bradford et al., *Journal of the Optical Society of America*, vol. 53, No. 9, Sep. 1963, pp. 1096-1100.

"Semiconductor Lasers for Telecommunictions", by J. E. Bowers et al., *Optical Fiber Telecommunications II*, Chapter 13, pp. 509-568 (no date).

*Primary Examiner*—James W. Davie
*Attorney, Agent, or Firm*—Eugen E. Pacher

[57] ABSTRACT

Disclosed are high reliability semiconductor lasers that need not be maintained inside a hermetic enclosure. Such lasers can advantageously be used in a variety of applications, e.g., in optical fiber telecommunications, and in compact disc players. Such "non-hermetic" lasers comprise facet coatings that comprise a dielectric layer that has very low water saturation value. In preferred embodiments this dielectric layer is $SiO_x (1 \leq x < 2)$, deposited by a molecular beam method. Deposition conditions are selected to result in a dense material that is largely free of particulates and blisters, and is substantially impermeable to moisture. Among the deposition conditions is substantially normal beam incidence, and a relatively low deposition rate. Deposition is advantageously carried out under relatively high vacuum conditions. A quantitative method of determining the water level in a $SiO_x$ film is disclosed.

7 Claims, 5 Drawing Sheets

ARTICLE COMPRISING A SEMICONDUCTOR LASER WITH STBLE FACET COATING

FIELD OF THE INVENTION

This invention pertains to the field of semiconductor devices, especially semiconductor lasers.

BACKTROUND OF THE INVENTION

The necessity of protecting and/or modifying the surface of most, if not all, semiconductor devices is well known. Although dielectric films that are suitable for some devices or classes of devices are known and widely used (e.g., $SiO_2$ on Si), there still exists, for instance, a great need for a suitable dielectric of appropriate refractive index that is mechanically and chemically stable, can be free from pinholes, microcracks, particulates and voids, that can have good adhesion and can be highly resistant to moisture penetration and adapted for use as semiconductor laser facet coating irrespective of emission wavelength.

A variety of dielectrics have been proposed, or are actually used, for coating of semiconductor laser facets. Among these dielectrics are yttrium stablized zirconia (YSZ), $Al_2O_3$, $Si_3N_4$, $SiO_xN_y$ and $SiO_x$.

However, currently used facet coatings have shortcomings. Among these are poor reproducibility with regard to refractive index and/or mechanical stress, and the frequent presence of particulates. Furthermore, and very importantly, currently used facet coatings typically are not stable in the ambient atmosphere, causing changes in laser properties, including early laser failure.

Primarily because of the shortcomings of currently used facet coatings, substantially all prior art high reliability semiconductor lasers are packaged such that they are located inside a hermetic (typically inert gas-filled) enclosure. Such prior art lasers will be referred to as "hermetic" lasers. They are widely used, for instance in optical fiber communications, optical interconnects, sensors, and printing. It will be readily apparent that the need for a hermetic enclosure adds substantial complexity to the manufacturing process, tends to reduce yield and, very importantly, substantially increases the cost of manufacture of semiconductor lasers. Thus, it would be highly desirable to be able to provide a high reliability laser with facet coatings that are stable in the ambient atmosphere, such that the laser need not be operated inside a hermetic enclosure. This application discloses such a coating, and also discloses such a laser, to be referred to as a "non-hermetic" laser.

Silicon monoxide is a dielectric that has many advantageous features. Among them are its relatively high vapor pressure (which facilitates deposition by thermal evaporation), its amorphous nature, and the relative ease of control of its refractive index. However, it has proven difficult to reproducibly deposit high quality $SiO_x(1 \leq x < 2)$ films. For instance, I-F. Wu et at., *IEEE Photonics Technology Letter*, Vol. 4(9), p. 991 (1992) report that typically the refractive index of $SiO_x$ films ". . . suffers from variations from run to run . . . ", necessitating complex in situ monitoring and process control to obtain $SiO_x$ laser facet coatings of the required thickness and refractive index. Lack of reproducibility of a process step clearly is a shortcoming that typically makes the process undesirable for commercial practice. Furthermore, prior art $SiO_x$ films are not adequate for use as protective coating from the ambient due to, typically, the presence of particulates, contamination, porosity, etc. Thus, it is not surprising that $SiO_x$ has not been widely used as a dielectric layer.

Molecular beam techniques have recently been employed for fabrication of dielectric thin films. See, for instance, I. T. Muirhead et al., *SPIE*, Vol. 1019, p. 190 (1988); S. P. Fisher, *SPIE*, Vol. 1266, p. 76 (1990); H. A. Macleod, *Laser Focus World*, November 1992, p. 111.

GLOSSARY AND DEFINITIONS

Herein the term "high reliability laser" (or equivalent ones) refers to a laser having, based on appropriate life testing, one or more of the following three attributes:

1) The laser is expected to perform, when essentially continuously biased, to its specifications for at least 7 years at an ambient temperature of 45° C. and an ambient relative humidity (RH)=50%, with an instantaneous hazard rate of less than 100 FITs at 7 years of operation.
2) The laser is expected to perform, when actively biased, to its specifications for at least 15 years at an ambient temperature of 45° C. and an ambient RH of 50%, with an instantaneous hazard rate less than 1500 FITs at 15 years of operation.
3) The laser can be operated without failure for at least 6 weeks at an ambient temperature of 85° C. and 85% RH, and a laser diode temperature of not more than 87° C.

Lasers that do not have at least one of the above recited attributes are herein referred to as "low reliability" lasers.

The unit "FIT" herein has its customary meaning, namely, "1 device failure in $10^9$ device hours." The acronym "FIT" stands for "failures in time ".

A laser "failure" has occurred if the laser current at a specified laser output power is greater than 150% of the starting laser current for that laser output power. Exemplarily, the specified output power is 3 mW.

The term "instantaneous hazard rate" herein has its customary meaning, namely, "the percentage of devices that fail at a given point in time".

A laser enclosure herein is a "hermetic" enclosure if the enclosure meets typical current specifications regarding permitted leak rate and moisture content. A typical specification requires a leak rate corresponding to a pressure rise less than $5 \times 10^{-8}$ Torr/second, and a moisture content of less than 5000 parts per million.

A "particle beam" is a substantially unidirectional flux of particles having a substantially defined lateral extent in an evacuated (background pressure typically less than about $10^{-5}$ Torr) chamber.

SUMMARY OF THE INVENTION

We have made the surprising discovery that, under appropriate processing conditions, high quality $SiO_x$ films, suitable for use as laser facet coating, can be reliably formed, and that semiconductor lasers comprising the novel $SiO_x$ film, operated in contact with the atmosphere, can be high reliability lasers.

In a broad aspect the invention is embodied in an article that comprises a high reliability semiconductor laser. The laser comprises a semiconductor body having two opposed facets, with a dielectric coating disposed on each of said facets. Significantly, the semiconductor body is not disposed inside a hermetic enclosure, whereby the dielectric layers are exposed to moisture from the ambient air, and frequently are in substantial contact with ambient air. In other respects the article can be conventional. Non-hermetic lasers according to the invention can be used substantially everywhere prior art hermetic high reliability lasers are used. Exemplary of such uses is optical fiber telecommunications, e.g., in transmitter packages, and in compact disc players.

In preferred embodiments the dielectric coating comprises material which has, after immersion in 99° C. de-ionized water for a time sufficient to result in saturation of the material with moisture, a moisture content less than 100 $\mu m^{-1}$, as determined by Fourier transform infrared absorption spectroscopy, in the manner as described in detail below. In currently preferred embodiments the dielectric material has composition $SiO_x$ ($1 \leq x < 2$).

A significant aspect of preferred embodiments of the invention is the ability to form a dielectric layer, typically a $SiO_x$ layer, that is dense, largely free from particulates and blisters, and substantially impermeable to moisture, as measured by the moisture saturation value of the layer material.

Departing from prior art practice, we have found that deposition by a molecular beam technique can have advantages over the conventional thermal evaporation technique. For instance, the latter frequently results in impingement of yield-reducing particles (emitted from the evaporation crucible) on the dielectric layer. This "spitting" problem can be essentially eliminated by the use of a molecular beam technique.

We currently believe that, in $SiO_x$ deposition by conventional thermal evaporation method, thermal gradients in the crucible in which the SiO source material is heated, as well as contamination of the source material, typically result in "spitting" of material from the source material boule. This results in scatter point defects in the growing film. Due to typically low arrival energy and the presence of residual water vapor in conventional deposition systems, initial nucleation sites are relatively far apart, resulting typically in columnar growth and thus a relatively high void ratio. This analysis of the conventional deposition process is provided for pedagogic reasons only, and the claimed invention in no way depends on the correctness of our analysis.

We have also found that it is typically desirable to have a load-lock connected to the deposition chamber, and to deposit the dielectric film in a deposition chamber that comprises means for gettering unwanted gases, typically water vapor, hydrogen, oxygen and nitrogen. Such gettering is exemplarily accomplished by means of a cryogenic shroud (typically liquid nitrogen cooled) inside (or as part) of the deposition chamber. Use of a titanium sublimation pump will also typically be advantageous.

A further desirable aspect of dielectric layer deposition on a major surface of a substrate body is positioning of the substrate body such that the molecular beam is incident substantially normally (i.e., with the angle between the beam direction and the direction normal to the major surface being less than 15°, preferably less than 10° or 5°) on the major surface. Substantially normal incidence avoids, we believe, a self-shadowing effect which can lead to a deposit having a columnar microstructure with intermediate voids. See, for instance, I. J. Hodgkinson, *Thin Solid Films*, Vol. 138, p. 289 (1986).

A still further desirable aspect is cleaning of the source material by thermal outgassing, and choice of deposition conditions such that the dielectric layer deposition rate is relatively low, typically less than 1.5 nm/second. Deposition at an appropriately low rate facilitates formation of dense dielectric material. In turn, provision of gettering means (or other means for removing unwanted background gases from the atmosphere in the deposition chamber) facilitates a low deposition rate by reducing the rate of incorporation of contaminants into the growing dielectric film.

We have found that a convenient measure of the quality of the dielectric film is the saturation moisture content of the film. Dielectrics such as $SiO_x$ can be readily saturated with moisture by maintaining the film in hot (e.g., 99° C.) de-ionized water for an appropriate period of time, e.g., 48 or 96 hours. Since, to the best of our knowledge, the prior art does not disclose a convenient quantitative technique for determining the moisture content of dielectric films such as $SiO_x$ films, we have devised such a technique. In order to be quantitative the technique requires deposition of the dielectric film on a conventionally polished Si substrate (typically a both-sided polished standard Si wafer) of predetermined thickness, e.g., 0.022 inches (0.56 mm). Those skilled in the art will readily understand that determination of the saturation moisture content of a first dielectric layer such as a laser facet coating requires deposition of a second (comparison) layer on the Si substrate, with the deposition conditions of the second layer being otherwise identically the same (to within the limits of experimental capability) as the deposition conditions of the first layer.

Those skilled in the art will appreciate that, for substantially all nominal compositions $SiO_x$, a $SiO_x$ film will typically comprise a surface layer of chemical composition different from the bulk of the layer material. Typically the surface layer composition is $SiO_2$, and the surface layer thickness is one to a few monolayers, typically substantially less than 10% of the total layer thickness. The presence of this unavoidable surface layer in general does not affect the technologically important properties of the layer.

Those skilled in the art will also understand that, in order to obtain, for instance, a desired reflectivity, a $SiO_x$ film according to the invention can be combined with one or more layers of other dielectric or semiconductor materials, e.g., Si, $SiO_2$, $Si_3N_4$ and/or $SiO_xN_y$.

DETAILED DESCRIPTION OF SOME PREFERRED EMBODIMENTS

Figure 1:
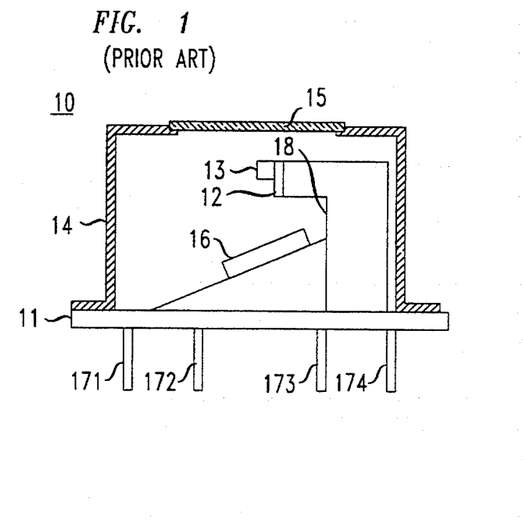
FIG. 1 schematically shows an exemplary prior art (hermetic) laser module.

FIG. 1 schematically shows an exemplary conventional (hermetic) laser module 10. Numeral 11 refers to the base, 18 to the copper heat spreader, 12 to the laser submount, 13 to the laser, 14 to the "lid" which is hermetically joined to base 11, 15 to the window through which the laser radiation is transmitted, and 16 to the (typically PIN) photodetector that serves to monitor the laser power to facilitate feedback stabilization of the laser power. Pins 171–174 provide electrical contact with the laser and the photodiode.

Figure 2:
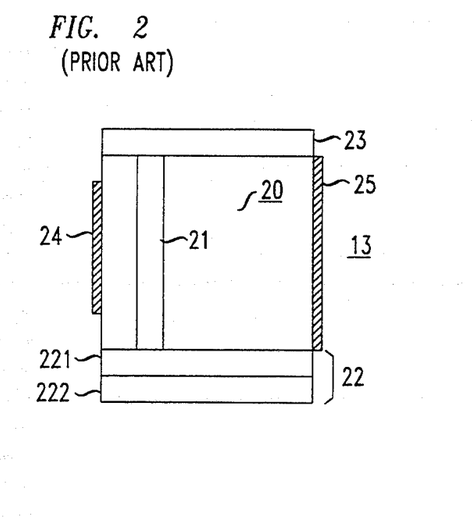
FIG. 2 schematically depicts an exemplary prior art semiconductor laser including conventional front and rear facet coatings and contact means.

FIG. 2 schematically depicts exemplary laser 13 in greater detail. Numeral 20 refers to the semiconductor body that comprises active region 21. Numeral 22 refers to the rear (high reflectivity) facet coating which comprises YSZ layer 221 and Si layer 222, and numeral 23 refers to the front (low reflectivity) facet coating which consists of a YSZ layer. Numerals 24 and 25 refer to contact means.

Figure 3:
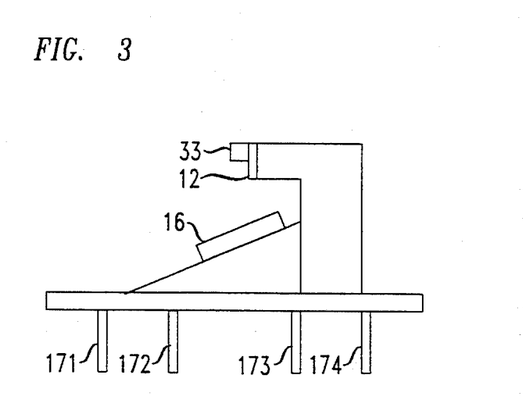
FIG. 3 schematically shows an exemplary (non-hermetic) laser module according to the invention.
Figure 4:
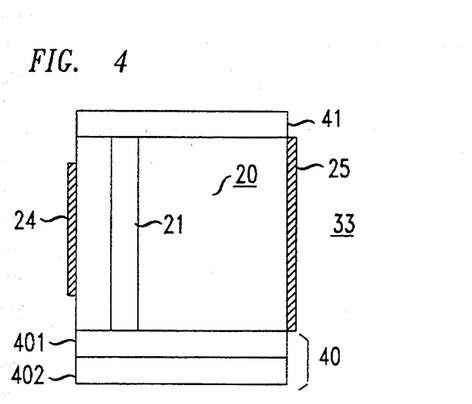
FIG. 4 schematically depicts an exemplary semiconductor laser according to the invention, including front and rear facet coatings and contact means.

FIG. 3 schematically shows an exemplary non-hermetic laser module according to the invention, which closely resembles the prior art module of FIG. 1, except for the absence of lid 14 and window 15. Of course, a significant difference exists with respect to the facet coatings of the laser, as can be seen in FIG. 4. The exemplary laser of FIG. 4 differs from that of FIG. 2 substantially only with regard to facet coating layers 401 and 41, which are dense, low saturation moisture content $SiO_x$. In order to achieve higher reflectivity, layers 401 and 402 can be sequentially repeated one or more times. Those skilled in the art know how to determine the appropriate number of pairs and thicknesses for facet coatings to achieve the desired facet reflectivity.

The embodiment of FIG. 3 is exemplary only, and other embodiments are contemplated. For instance, a lid of the type shown in FIG. 1 could still be provided, for mechanical protection, but the window need not be hermetically joined to the lid, and the lid need not be hermetically joined to the base. Clearly, the elimination of the hermiticity requirement can lower production costs through, e.g., increased yield, assembly and testing costs, and through the possibility of using less costly piece parts and/or joining methods.

Figure 5:
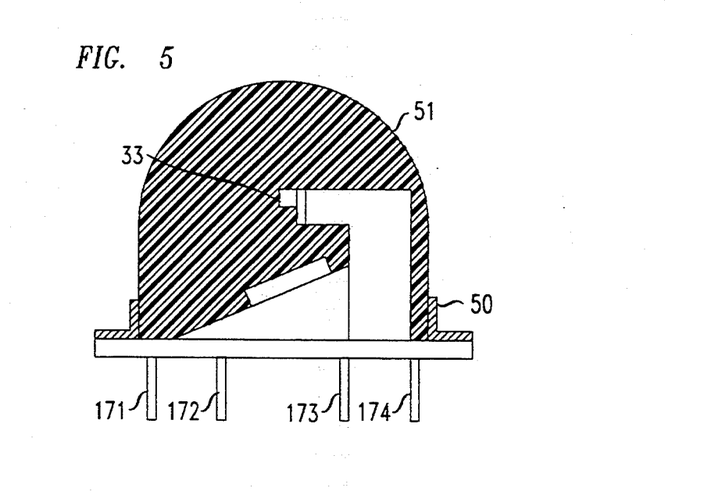
FIG. 5 shows schematically another exemplary non-hermetic laser module.

FIG. 5 schematically shows another exemplary laser module according to the invention, wherein numeral 50 refers to (optional) retaining means, and 51 refers to a quantity of polymer (e.g., silicon-polyimide copolymer) that serves to provide mechanical protection for laser 33. Those skilled in the art know that polymers (including epoxy) typically are relatively permeable for water vapor and other gases, and do generally not provide a hermetic environment for the laser.

Figure 6:
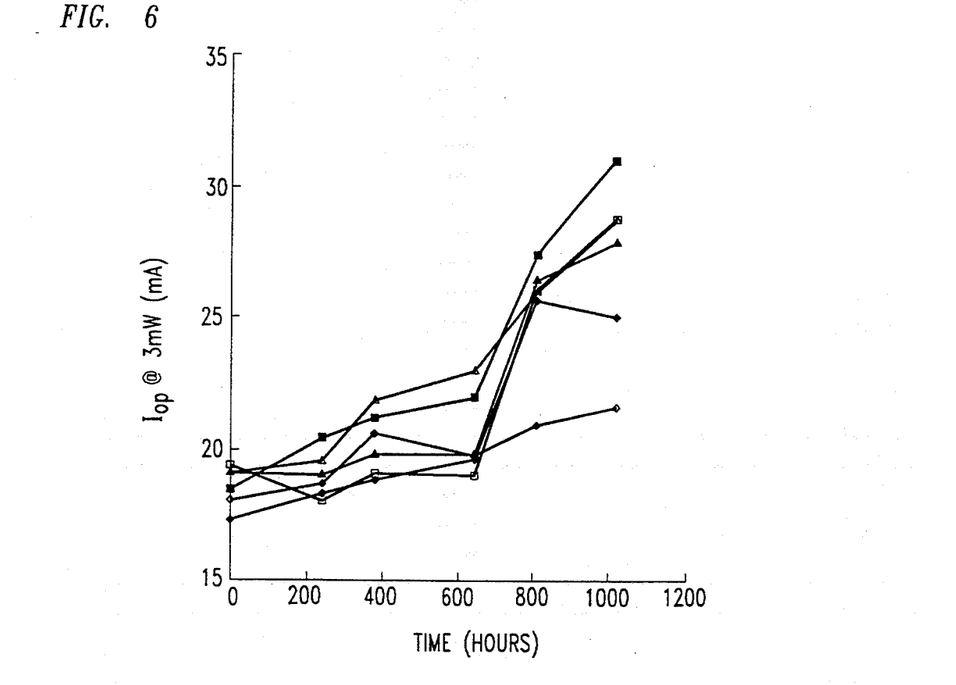
FIGS. 6–7 show aging data for exemplary prior art lasers emitting at 1.3 $\mu m$.
Figure 7:
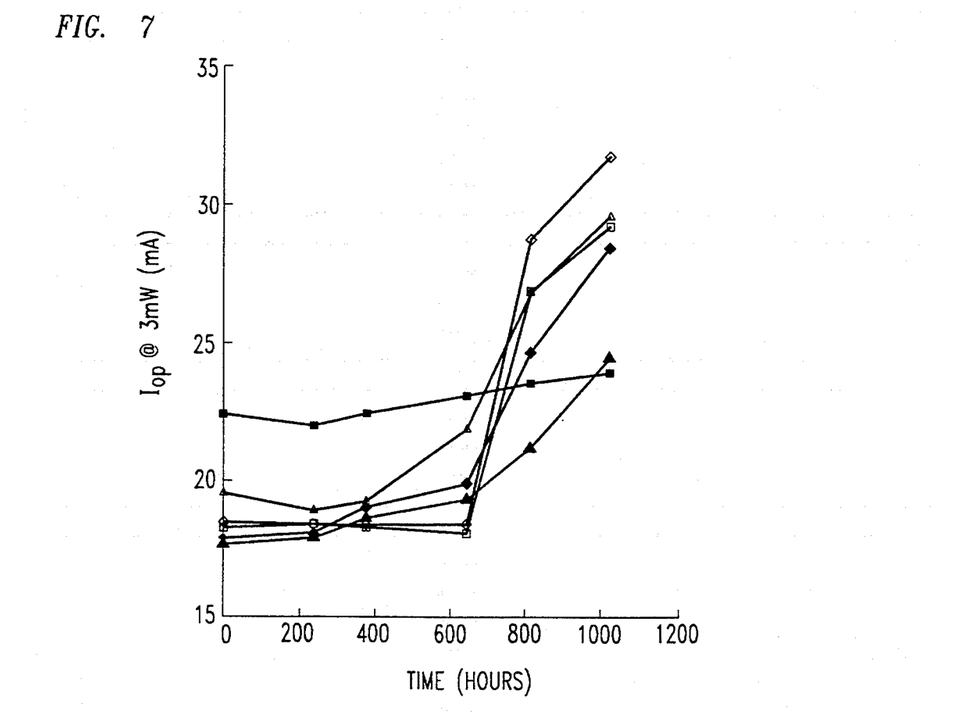

FIGS. 6–7 show exemplary aging data for some prior art lasers with 30% low reflectivity (LR), 70% high reflectivity (HR) facet coatings that were operated under non-hermetic conditions. The laser diodes were conventional multimode InP-based buried heterostructure diodes emitting at 1.3 μm. They were assembled into a conventional hermetic package, substantially as shown in FIG. 1, followed by a conventional burn-in. Only devices that passed the burn-in were aged further. After characterization at 25° C. and 85° C., the laser modules were rendered non-hermetic by making an opening in the side of the lid. After re-characterization at 25° C., the devices were loaded into a conventional aging chamber. After the chamber reached equilibrium at 85° C./90% relative humidity (RH), a 30 mA bias current was applied to each device. The bias current was below the lasing threshold current at 85° C. At appropriate times devices were removed from the chamber and the conventional L-I-V characteristics were measured at 25° C. After completion of a set of measurements the devices were returned to the aging chamber and aging continued.

FIG. 6 shows aging data for several modules that contained laser-diodes with conventional YSZ LR and YSZ/Si HR facet coatings, substantially as shown in FIG. 2, and FIG. 7 shows such data for modules that contained laser diodes with Y-doped $Al_2O_3$ LR and $Al_2O_3$/Si HR facet coatings. The data clearly show progressive deterioration of the characteristics of the prior art laser diodes operated under non-hermetic conditions.

Figure 8:
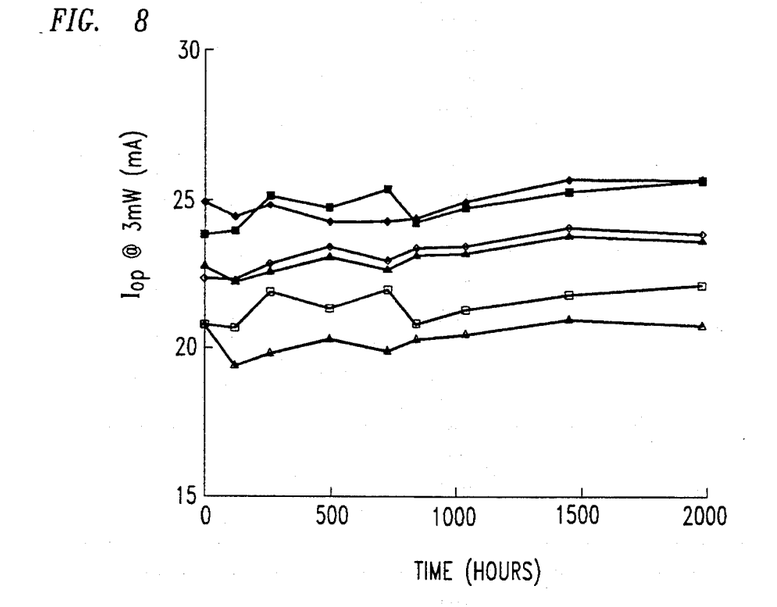
FIG. 8 shows aging data for exemplary hermetic lasers with YSZ facet coatings.
Figure 9:
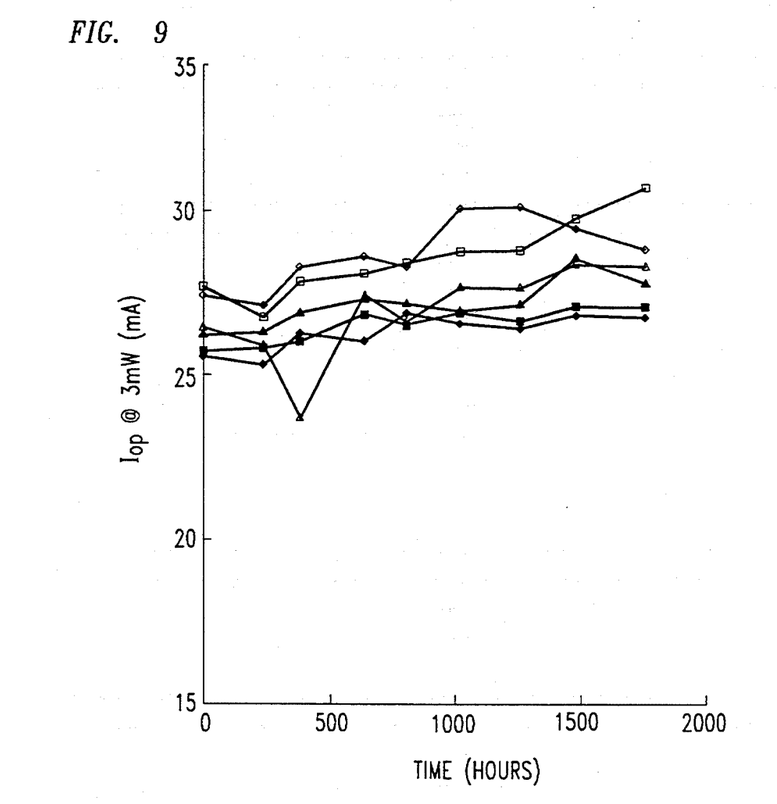
FIG. 9 shows aging data for analogous non-hermetic lasers with SiO facet coatings.

FIG. 8 shows analogous aging data for hermetic laser modules that contained laser diodes with 30% YSZ LR and 70% YSZ/Si HR facet coatings, and FIG. 9 shows analogous data for non-hermetic laser modules that contained laser diodes with high density (neutral) $SiO_x$ facet coatings. By a "neutral" facet coating we mean a coating that essentially has no effect on the reflectivity of the facet, and by "hermetic" modules we mean modules produced as described above, except that no opening was made in the lid. As FIGS. 8 and 9 demonstrate, there is little if any difference in the aging behavior of hermetic YSZ-coated laser modules and non-hermetic laser modules with facets coated with the novel high density $SiO_x$. Furthermore, comparison of the data of FIG. 9 with the data of FIGS. 6 and 7 clearly reveals the substantial improvement that results from substitution of the novel $SiO_x$ film for conventional YSZ or Y-doped $Al_2O_3$ facet coatings.

Continued aging of the above described non-hermetic modules up to 1750 hrs has resulted in failure of all non-hermetic modules except for the modules that contain lasers with the high density $SiO_x$ facet coatings shown in FIG. 9.

As those skilled in the art know, aging data of the type shown in FIGS. 6–9 can be used to obtain estimates of the expected lifetime of lasers. For instance, we have determined that the exemplary non-hermetic lasers according to the invention can meet or exceed all requirements for high reliability lasers, as defined above. Furthermore, the devices can meet an instantaneous hazard rate requirement of fewer than 1000 FITs at 15 years at 45° C./50% RH, and furthermore can meet a requirement that fewer than 5% of the devices fail in 15 years, also at 45° C./50% RH.

Preferred lasers according to the invention comprise a high quality $SiO_x$ film, as measured for instance in terms of saturation moisture content. To the best of our knowledge, the prior art neither discloses how to obtain such a film nor suggests the possibility of obtaining such a film by appropriate choice of deposition conditions. One measure of the quality of the films is the stability of the refractive index and thickness of the films, with high stability being indicative of high density material.

For instance, the initial refractive index at 0.6328 μm of a SiO film, deposited at 15° off the normal direction on a (100) Si wafer (nominal substrate temperature 0° C., deposition rate 1.4 nm/s, chamber pressure $1 \times 10^{-10}$ Torr) was 1.98, but was 1.94 after a 60 hour soak in room temperature de-ionized water. On the other hand, a film that was deposited as recited above, but with a substantially normal incidence beam, had initial refractive index 1.988, and 1.987 after the same immersion treatment.

We have also found that typically the refractive index increases and the etch rate of the film in a dilute HF solution decreases with increasing substrate temperature $T_s$ and/or with decreasing deposition rate at a given $T_s$. Both of these are indicative of increasing film density. Thus, in preferred embodiments $T_s$ is in the range 0°-200° C.

Among the desirable processing conditions is also a relatively low deposition rate, preferably less than 1.5 nm/second. $SiO_x$ films deposited at substantially normal incidence at suitably low deposition rate (e.g., 0.2 nm/s for a SiO film) essentially did not absorb water even if submerged for 192 hours in 99° C. de-ionized water. This was established by Fourier transform infrared (IR) absorption spectroscopy using a conventional spectrometer (Mattson model Sirius 100). It is known that the absorption spectrum between 3000 $cm^{-1}$ and 3700 $cm^{-1}$ provides information about water absorbed in $SiO_x$ films. Films deposited at relatively high deposition rates, typically $\geq 1.5$ nm/second, frequently are not dense enough to be useful for reliable non-hermetic lasers.

After film deposition onto 5 cm diameter both-sided polished conventional (100) Si wafers of thickness 0.022 inches, the films were baked at 150° C. for 48 hours in air. After taking the IR absorption spectrum, the films were soaked in 99° C. de-ionized water for 16, 48, 96 and 192 hours. Spectra were taken within 30 minutes of removal from the water bath.

Figure 10:
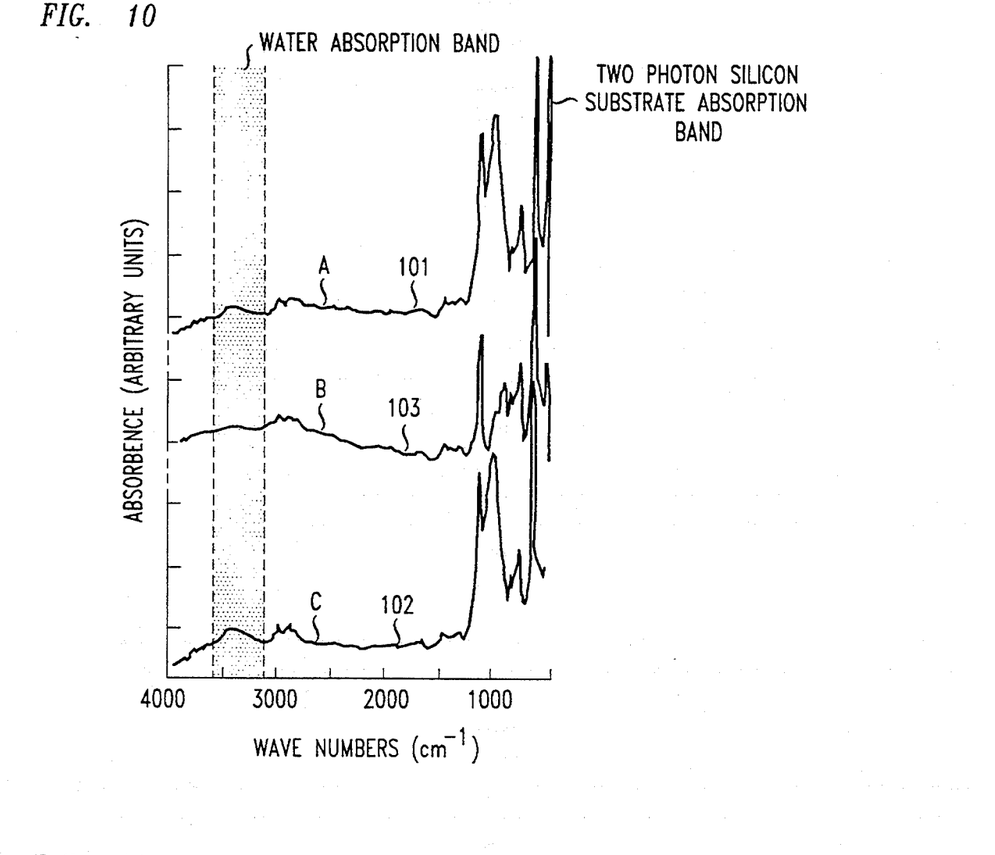
FIG. 10 shows spectroscopic data for a SiO film according to the invention before and after immersion in hot water, and for silicon.
Figure 11:
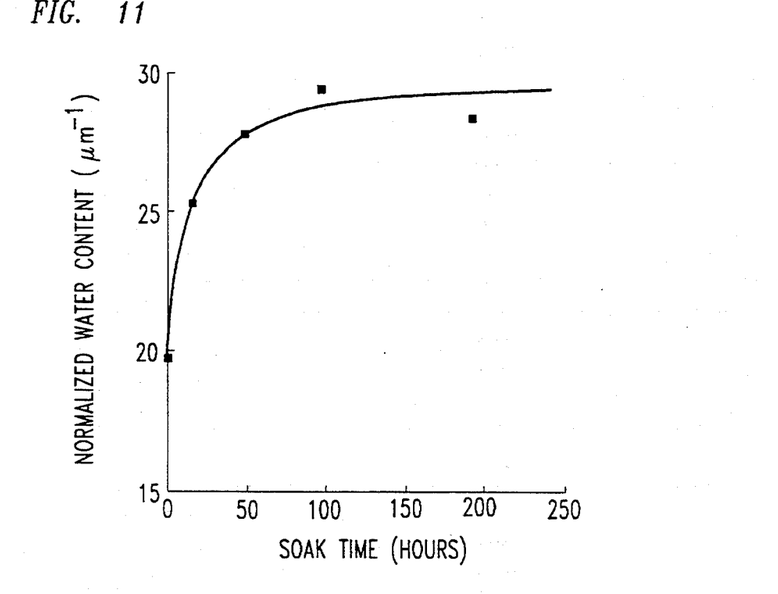
FIG. 11 provides data on the water content of SiO films vs. soak time of the films in hot water.

FIG. 10 shows the relevant portions of IR spectra of a 190 nm thick SiO film ($T_s = 100$ ° C., deposition rate 1.1 nm/s, no $O_2$ over-pressure), and of the Si substrate, with numerals 101, 102 and 103 referring, respectively, to the baked SiO film, to the SiO film after 192 hours in 99° C. water, and to the Si substrate. An increase in the OH−/SiOH absorption peak is indicative of moisture absorption. The increase in moisture content of the film was quantified by first normalizing the area between 3000 and 3700 $cm^{-1}$ with the film thickness (immersion of the film in the 99° C. water resulted in thinning of the film at a rate of about 0.1 nm/hour), then ratioing this to the area of the two-photon substrate absorption band at 610–620 $cm^{-1}$, which has constant area. The results are shown in FIG. 11, and indicate a minimal increase in the normalized water content, from about 20 $\mu m^{-1}$ to a saturation value of about 30 $\mu m^{-1}$.

The above described experimental procedure can provide a numerical value for the moisture content of a $SiO_x$ film (as well as of other dielectric films), provided the film is deposited on a two-sided polished Si substrate of standard thickness. We have used wafers of thickness 0.022 inches. This procedure can be readily used to determine whether or not a given dielectric film on a semiconductor substrate (e.g., a laser facet coating) meets the low saturation moisture content of preferred films.

By the same technique we have also measured the moisture content of conventional as-deposited PECVD $SiO_2$ films ($T_s = 325$° C., 13.56 MHz, 100 W/cm², 2 Torr pressure, 150 cc/minute TEOS (tetraethylorthosilicate) and 7000 cc/minute of $O_2$)), and find values of normalized water content of order 100–300 $\mu m^{-1}$. Thus, saturated SiO film, even if deposited at the relatively high rate of 1.1 nm/s, can have less than about one-third of the moisture content of as deposited conventional PECVD $SiO_2$ film. Of course, immersion of the conventional $SiO_2$ films in hot water results in a substantial increase in the observed values of normalized water content. $SiO_x$ films deposited under appropriate conditions (e.g., $O_2$ overpressure) yielded results similar to those observed with SiO films, with lower deposition rates also typically yielding reduced saturation content.

Figure 12:
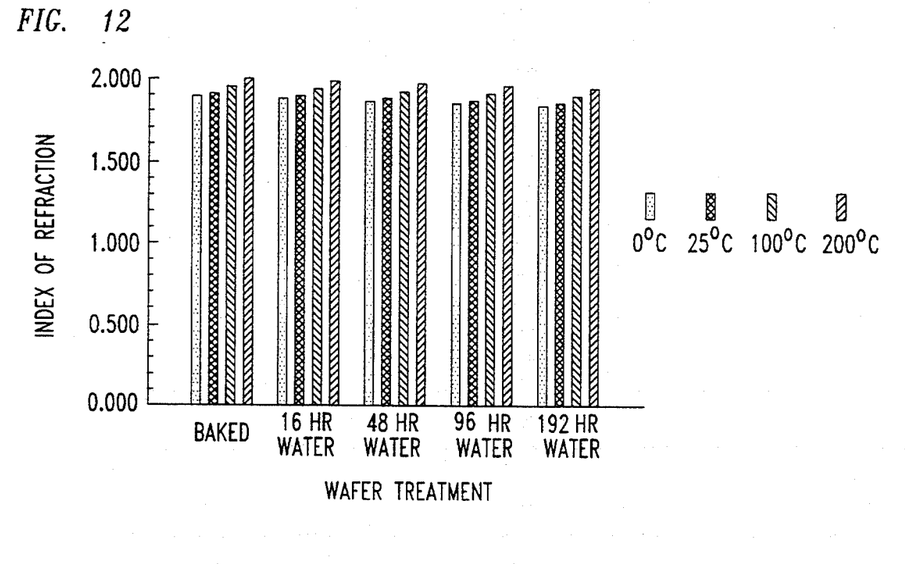
FIGS. 12 and 13 show data respectively on refractive index and thickness of SiO films deposited at substrate temperatures from 0° C. to 200° C., as a function of laser treatment of the SiO films.
Figure 13:
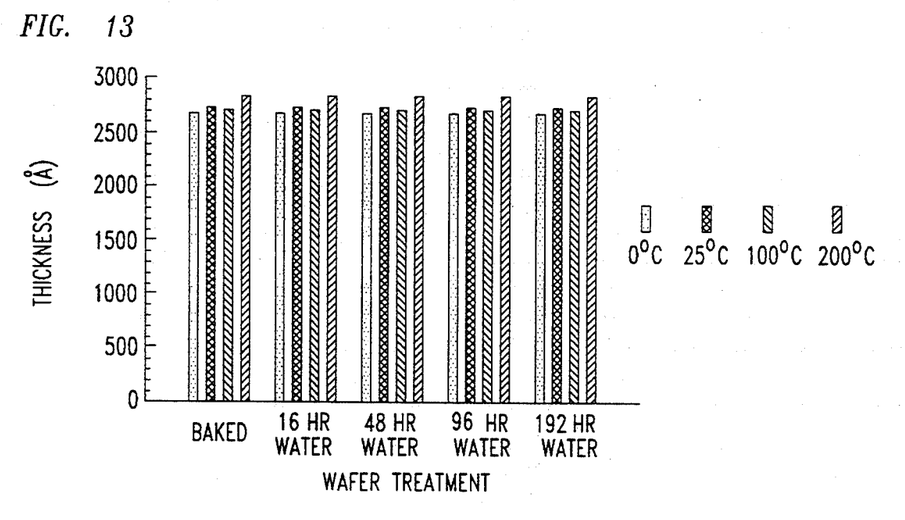

Moisture sensitivity was totally absent (to within the sensitivity of our measurement technique) when the deposition rate was 0.2 nm/s. FIGS. 12 and 13 show data on refractive index and thickness, respectively, for SiO films deposited at nominal $T_s$ of 0° C., 25° C., 100° C. and 200° C., respectively, at 0.2 nm/s, for "baked" films, and after 16, 48, 96 and 192 hours in 99° C. water. FIGS. 12 and 13 show substantially no change as a function of wafer treatment, including change of deposition temperature, indicative of the absence of moisture uptake. Furthermore, IR spectroscopy did not reveal any moisture absorption. We believe that substantially similar results will be obtained at a deposition rate of 0.5 nm/s or less, with low moisture absorption films obtainable at rates of 1.5 nm/s or less.

Rutherford backscattering spectroscopy established that $SiO_x$ films produced as described typically were amorphous and stoichiometrically uniform to within the resolution limit of the measurement technique (~5%). Such uniformity is desirable, especially if low moisture uptake is desired. Films deposited without $O_2$ overpressure at $T_s \leq 300$° C. were SiO, with $O_2$ overpressure resulting in $SiO_x (1 < x < 2)$.

$SiO_x$ films were grown also on GaAs and InP wafers, and were found to have properties substantially like the corresponding films grown on Si. The films typically were free of voids and inclusions of different crystalline or amorphous phases, to a transmission electron microscopy detection limit of $< 10^8$ $cm^{-1}$ and dimensions $> 2–3$ nm. These advantageous properties are not suggested by prior art results (e.g., A. P. Bradford et al., *J. of the Optical Soc. of America*, Vol. 53 (9), p. 1096 (1963)), who disclose that films deposited at low rates (e.g., $< 0.5$ nm/s) and relatively high $O_2$ pressure ($8 - 10 \times 10^{-5}$ Torr) ". . . consist predominantly of $Si_2O_3$ . . . ", suggesting multiphase films.

A very desirable optional feature of the deposition method is provision of means that facilitate carrying out two or more process steps without exposure of the semiconductor body to the ambient atmosphere. One of the steps is deposition of the $SiO_x$ film, and the other step typically is an earlier step, e.g., deposition of III/V semiconductor material. We have used a dual chamber Riber MBE 32 system, with one of the chambers used for III-V epitaxy and the other for deposition of $SiO_x$. Means are provided for moving a sample from one chamber to the other under vacuum. The $SiO_x$ deposition chamber has an ion pump and a 2200 l/s turbo pump, the latter being desirable for initial cleaning of the SiO charge, which typically outgasses extensively, despite its typically high (exemplarily 5N) purity. After outgassing, and without $O_2$ being leaked into the chamber, the ion pump can maintain the chamber pressure below $1\times 10^{-10}$ Torr up to an effusion cell temperature of 1200° C. Film deposition typically was done at cell temperatures in the range 1050°–1150° C., with $T_s \leq 300°$ C. The molecular flux was determined in a conventional manner by means of an ion gauge. Frequent outgassing of the gauge filament is desirable in order to obtain reproducible results. Oxygen overpressure, typically in the range $10^{-5}$–$10^{-7}$ Torr and obtained by introduction of oxygen into the chamber by means of a controlled leak valve, can be used to vary the oxygen content, and thus the refractive index, of the deposit. The deposition chamber is also equipped with a load lock which makes possible introduction of samples without opening of the chamber to the ambient atmosphere.

A further advantageous optional feature is the use of an effusion cell as the means for providing the Si and O-comprising beam. Use of the effusion cell facilitates deposition of $SiO_x$ films having very low particulate density, substantially eliminating one yield-reducing shortcoming of the conventional deposition technique, namely, particle "spitting". $SiO_x$ films can also be formed by co-evaporation of SiO and $SiO_2$ from effusion cells.

Non-hermetic high reliability lasers are not the only possible embodiments of the invention. For instance, other embodiments utilize the observed significant etch rate difference in HF solutions between the high quality SiO produced according to our procedure and $SiO_2$. We found that in 10% HF solution the etch rate of our SiO is significantly lower than that of conventionally deposited PECVD $SiO_2$ ($T_s=300°$ C.), and decreases with increasing $T_s$. Our SiO films did not etch at all in a conventional buffered HF solution, to within the limits of our measurement techniques. Thus, our SiO films can be used as a mask layer in semiconductor device manufacture. Exemplarily, such films can be used in making self-aligned features by using SiO patterns to define predetermined features, and using PECVD $SiO_2$ as a removable selective mask in a multi-step etch process. For instance, using $CH_4/H_2$ reactive ion etching, we etched 3 μm deep mesas on an InP substrate with SiO and PECVD $SiO_2$ as masks, and re-grew InP around the mesas by conventional OMVPE.

Other uses of the high quality $SiO_x$ films produced according to our procedure are also contemplated. Among these are optical coatings on opto-electronic devices other than non-hermetic lasers, e.g., LEDs, detectors, and solar cells, as well as optical coatings on optical components such as lenses. Furthermore, use of the high quality $SiO_x$ films to passivate semiconductor or dielectric (e.g., lithium niobate) surfaces, as gate oxide in FETs or as dielectric in bipolar transistors, as resistive field shield, and as high dielectric constant thin insulator film for capacitors is also contemplated.

Furthermore, the properties of the $SiO_x$ films can be readily tailored by doping to meet particular requirements. This is exemplarily accomplished by provision of one or more additional beams during layer deposition. For instance, dopants such as $SiO_2$, $Si_3N_4$, $N_2$, $GeH_4$, $PH_3$, $B_2O_3$, $O_2AsH_3$, $SiH_4$, $NF_3$ or $B_2H_6$ can be provided from a conventional effusion cell or leak valve, and can be used to achieve desired values of, e.g., refractive index, loss, resistivity or ion diffusion. Still furthermore, aspects of the above described deposition technique can also be used in the deposition of other dielectrics such as $Al_2O_3$, YSZ, $TiO_2$, $Si_3N_4$, $SiO_xN_y$ and $BaTiO_3$, and may result in improved properties of these materials.

Figure 14:
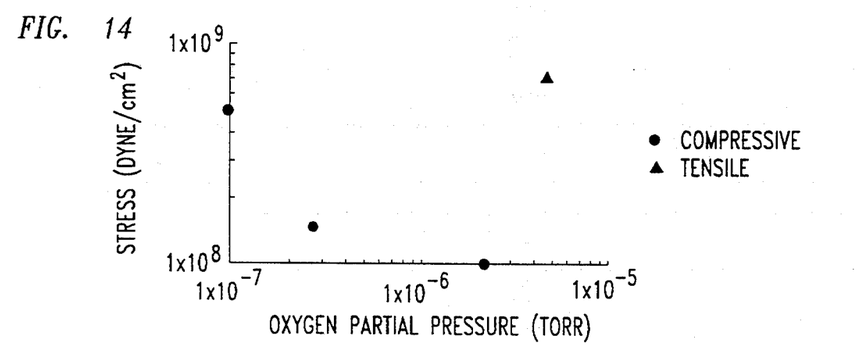
FIG. 14 shows data on stress in a $SiO_x$ film as a function of oxygen content.

It is known that mechanical stress at the dielectric/semiconductor interface correlates with the midgap interface state carrier density, and that the presence of stress can affect the ability of a dielectric film to act as diffusion barrier. It is thus advantageous that the stress state of $SiO_x$ films according to the invention can be predetermined and readily controlled by means of the oxygen partial pressure during deposition. This is illustrated by FIG. 14, which shows exemplary data on stress as a function of $O_2$ partial pressure for a $SiO_x$ film on a Si substrate, wherein the stress is tensile for $O_2$ partial pressure less than about $2\times 10^{-6}$ Torr, and is compressive for $O_2$ partial pressure greater than about $2\times 10^{-6}$ Torr. Similar behavior is observed on GaAs and InP substrates.

Lasers according to the invention can be produced by any suitable conventional technique, provided facet coating conditions are selected to yield high quality (low moisture content) films as described. See, for instance, "Optical Fiber Telecommunications II", edited by S. E. Miller et al., Academic Press, 1988, especially chapter 13, for a description of conventional lasers. It will be understood that lasers according to the invention are not limited to an emission wavelength of 1.3 μm but can emit at any desired wavelength, typically in the spectral region that includes the visible and near infrared.

Exemplarily, conventional 1.3 μm capped mesa buried heterostructure (CMBH) lasers were made on a InP wafer in conventional fashion, up to and including wafer thinning, contact metal deposition, and cleaving of the wafer into bars. The cleavage surfaces are the laser facets. After loading the bars into a conventional fixture the bars were inserted into the loadlock of the previously referred to Riber deposition system. After pump-down of the loadlock to $<10^{-6}$ Torr, the laser bars were transferred into the deposition chamber, where an about 0.35 μm thick SiO film was deposited at essentially normal incidence on one facet of the bars. $T_s$ was about 100° C., the deposition rate was 1.2 nm/s, and the background pressure in the chamber was $6.5\times 10^{-11}$ Torr. After completion of the deposition the fixture was removed from the chamber, turned 180° to expose the other facet of the bars, reloaded into the chamber, and a 0.35 μm thick SiO film deposited on the other facet, substantially as described above. After completion of facet coating deposition the bars were removed from the chamber and separated by conventional means into individual laser diodes. The lasers were bonded onto submounts, the submounts were bonded into the package, and the active layer side of the laser was wire bonded to the package, all in conventional fashion. Subsequently the lasers were tested, substantially as described above, including operation of the lasers in contact with the ambient atmosphere, and/or at high temperature/high humidity. The test results indicated that the non-hermetic lasers have an expected lifetime substantially the same as analogous hermetic comparison lasers with conventional YSZ facet coatings.

We claim:

1. An article comprising a semiconductor laser comprising a semiconductor body having two opposed laser facets, with a dielectric layer disposed on each of said facets;

said laser is a high reliability laser, and said semiconductor body is not disposed inside an essentially hermetic enclosure, whereby said dielectric layers are exposed to moisture from the ambient atmosphere; wherein each of said dielectric layers comprises a first dielectric material selected to have, after immersion in 99° C. deionized water for a time sufficient to result in saturation of the first dielectric material with moisture, a moisture content of less than 100 $\mu m^{-1}$.

2. An article according to claim 1, wherein said first dielectric material has composition $SiO_x$, with $1 \leq x < 2$.

3. An article according to claim 1, wherein associated with a given laser facet is a direction normal to the facet, and wherein the dielectric layer disposed on the given facet comprises $SiO_x$ ($1 \leq x < 2$), said $SiO_x$ deposited on the given facet by a method that comprises exposing the given facet to a Si- and O-containing particle beam, associated with the beam being a beam direction and an angle between said beam direction and the direction normal to the facet, said angle being less than 15°.

4. An article according to claim 3, wherein the $SiO_x$ on the given facet was deposited at a rate of no more than 1.5 nm/second.

5. An article according to claim 1, wherein at least a part of said semiconductor body is substantially covered by a polymer material.

6. An article according to claim 1, wherein said semiconductor body is disposed within a non-hermetic enclosure.

7. An article comprising a semiconductor body having a major surface, with a dielectric layer disposed on said major surface, CHARACTERIZED IN THAT
said dielectric layer comprises material of composition $SiO_x$ ($1 \leq x < 2$), said material selected to have, after immersion in 99° C. de-ionized water for a time sufficient to result in saturation of the material with moisture, a moisture content of less than 100 $\mu m^{-1}$.

* * * * *